United States Patent
Hsu et al.

(10) Patent No.: US 11,329,222 B2
(45) Date of Patent: May 10, 2022

(54) RESISTIVE RANDOM ACCESS MEMORY AND MANUFACTURING METHOD THEREOF

(71) Applicant: Winbond Electronics Corp., Taichung (TW)

(72) Inventors: Po-Yen Hsu, New Taipei (TW); Bo-Lun Wu, Changhua County (TW); Ting-Ying Shen, Chiayi (TW)

(73) Assignee: Winbond Electronics Corp., Taichung (TW)

( * ) Notice: Subject to any disclaimer, the term of this patent is extended or adjusted under 35 U.S.C. 154(b) by 244 days.

(21) Appl. No.: 16/839,270

(22) Filed: Apr. 3, 2020

(65) Prior Publication Data
US 2020/0321521 A1 Oct. 8, 2020

(30) Foreign Application Priority Data
Apr. 3, 2019 (TW) ................................ 108111859

(51) Int. Cl.
*H01L 45/00* (2006.01)
*G11C 13/00* (2006.01)
*H01L 27/24* (2006.01)

(52) U.S. Cl.
CPC ...... *H01L 45/1253* (2013.01); *G11C 13/0007* (2013.01); *H01L 27/24* (2013.01); *H01L 45/145* (2013.01)

(58) Field of Classification Search
CPC ... H01L 45/1253; H01L 27/24; H01L 45/145; H01L 45/04; H01L 45/16; H01L 27/2463; H01L 45/1233; H01L 45/146; G11C 13/0007
See application file for complete search history.

(56) References Cited

U.S. PATENT DOCUMENTS 9,859,335 B1 1/2018 Hsu et al.
2021/0066594 A1* 3/2021 Lee ..................... H01L 45/146

FOREIGN PATENT DOCUMENTS

| CN | 1677559 B | 12/2010 |
|---|---|---|
| CN | 106796983 A | 5/2017 |
| CN | 104995684 B | 5/2018 |

* cited by examiner

*Primary Examiner* — Allison Bernstein
(74) *Attorney, Agent, or Firm* — Muncy, Geissler, Olds & Lowe, P.C.

(57) ABSTRACT

A resistive random access memory (RRAM) and its manufacturing method are provided. The RRAM includes a substrate having an array region and a peripheral region. A plurality of memory cells and a gap-filling dielectric layer overlying the memory cells are located on the substrate and in the array region. A buffer layer only in the array region covers the gap-filling dielectric layer, and its material layer is different from that of the gap-filling dielectric layer. A first low-k dielectric layer is only located in the peripheral region, and its material is different from that of the buffer layer. A dielectric constant of the first low-k dielectric layer is less than 3. A top surface of the first low-k dielectric layer is coplanar with that of the buffer layer. A first conductive plug passes through the buffer layer and the gap-filling dielectric layer and contacts one of the memory cells.

14 Claims, 5 Drawing Sheets

RESISTIVE RANDOM ACCESS MEMORY AND MANUFACTURING METHOD THEREOF

CROSS REFERENCE TO RELATED APPLICATIONS

This Application claims priority of Taiwan Patent Application No. 108111859, filed on Apr. 3, 2019, the entirety of which is incorporated by reference herein.

BACKGROUND

Field of the Disclosure

The present disclosure relates to a memory device, and in particular, it relates to a resistive random access memory and a method for manufacturing the resistive random access memory.

Description of the Related Art

Resistive random access memory (RRAM) has advantages, such as having a simple structure, a small area, a low operating voltage, a fast operating speed, and a long memory-retention time. It is also capable of multi-bit storage and low power consumption. Hence, RRAM has great potential to replace the current standard, flash memory, as the main type of non-volatile memory for the next generation.

In a conventional RRAM, a wafer typically includes an array region and a peripheral region. The array region includes a plurality of memory cells, and each of the memory cells includes a patterned bottom electrode layer, a patterned resistance transition layer, and a patterned top electrode layer. The peripheral region includes logic circuits. In order to increase the operating speed of logic circuits, the dielectric layer in the peripheral region typically uses a low dielectric constant (low-k) dielectric material. However, the gap-filling ability of the low-k dielectric material is not good enough and the space between the memory cells is small, such that there may be voids between the memory cells when using the low-k dielectric material for filling the space between the memory cells. As a result, the operation error of the RRAM may occur easily, and the yield and reliability of the product may deteriorate.

Furthermore, when an etching process is performed to form openings which define the conductive plugs, the opening depths required in the array region and in the peripheral region are different. If the openings in the array region and the openings in the peripheral region are formed under the same condition, the memory cells may be excessively etched and damaged. Therefore, the reliability and yield of the RRAM may be reduced. On the other hand, if the above-mentioned openings in the array region and the peripheral region are respectively formed in different etching processes, the complexity of the process, the production cost, and the production time will be greatly increased.

For the memory industry, in order to improve the reliability and yield of resistive random access memory, and to reduce the cost and time required for production, there is still a need to improve structures and processes of the RRAM.

BRIEF SUMMARY

The disclosure provides a resistive random access memory (RRAM) and a method for manufacturing the same. The manufacturing method of the RRAM can significantly improve the yield and reliability of the product, and can reduce the complexity of the process, the production cost, and the production time.

The disclosure provides a RRAM including a substrate, a plurality of memory cells, a gap-filling dielectric layer, a buffer layer, a first low-k dielectric layer, and a first conductive plug. The substrate has an array region and a peripheral region. The plurality of memory cells are located on the substrate and in the array region. The gap-filling dielectric layer is located in the array region and covers the memory cells. The buffer layer covers the gap-filling dielectric layer, and is only located in the array region. The material of the buffer layer is different from the material of the gap-filling dielectric layer. The first low-k dielectric layer is only located in the peripheral region, and the material of the first low-k dielectric layer is different from the material of the buffer layer. The dielectric constant of the first low-k dielectric layer is less than 3, and the top surface of the first low-k dielectric layer is coplanar with the top surface of the buffer layer. The first conductive plug passes through the buffer layer and the gap-filling dielectric layer, and is in contact with one of the memory cells.

The disclosure also provides a method for manufacturing a RRAM. The method includes providing a substrate having an array region and a peripheral region. The method includes forming a plurality of memory cells on the substrate and in the array region. The method includes forming a gap-filling dielectric layer in the array region and covering the memory cells. The method includes forming a buffer layer covering the gap-filling dielectric layer, and the buffer layer is only located in the array region. The material of the buffer layer is different from the material of the gap-filling dielectric layer. The method includes forming a first low-k dielectric layer only in the peripheral region, and the material of the first low-k dielectric layer is different from the material of the buffer layer. The dielectric constant of the first low-k dielectric layer is less than 3, and the top surface of the first low-k dielectric layer is coplanar with the top surface of the buffer layer. The method includes forming a first conductive plug. The first conductive plug extends through the buffer layer and the gap-filling dielectric layer, and is in contact with one of the memory cells.

In the RRAM provided by the embodiments of the present invention, a buffer layer is formed to cover the entire array region, thereby improving the mechanical strength of the gap-filling dielectric layer. Even if the gap-filling dielectric layer of the array region and the dielectric layer of the peripheral region use different kinds of dielectric material, the gap-filling dielectric layer is not easily damaged during the chemical mechanical polishing process (CMP). Therefore, the dielectric materials of the array region and the peripheral region can be selected independently to meet requirements. Furthermore, the buffer layer protects the memory cells located in the array region during the etching process. Therefore, the openings in the array region and the peripheral region can be formed simultaneously, i.e., in the same etching process. As a result, the yield and reliability of the product can be significantly improved without significantly increasing the complexity of the process, the production cost, or the required production time.

BRIEF DESCRIPTION OF THE DRAWINGS

For a more complete understanding of the present disclosure, and the advantages thereof, reference is now made to the following descriptions taken in conjunction with the accompanying drawings, in which.

DETAILED DESCRIPTION

The present disclosure is best understood from the following detailed description when read with the accompanying figures. It should be noted that, in accordance with the standard practice in the industry, various features are not drawn to scale. In fact, the relative dimensions of the various features may be arbitrarily increased or reduced for clarity of discussion. In addition, the present disclosure may repeat reference numerals and/or letters in the various examples. This repetition is for the purpose of simplicity and clarity and does not in itself dictate a relationship between the various embodiments and/or configurations discussed.

In this disclosure, the low-k dielectric material has a dielectric constant less than 3. The material of the low-k dielectric layer may include SiLK™, low-k flowable oxide (FOx), fluorinated silicate glass (FSG), hydrogen silsesquioxane (HSQ), methylsilsesquioxane (MSQ), Nanoglass, Black Diamond™, Coral™, Aurora™ or another known low-k dielectric material.

Figure 1A:
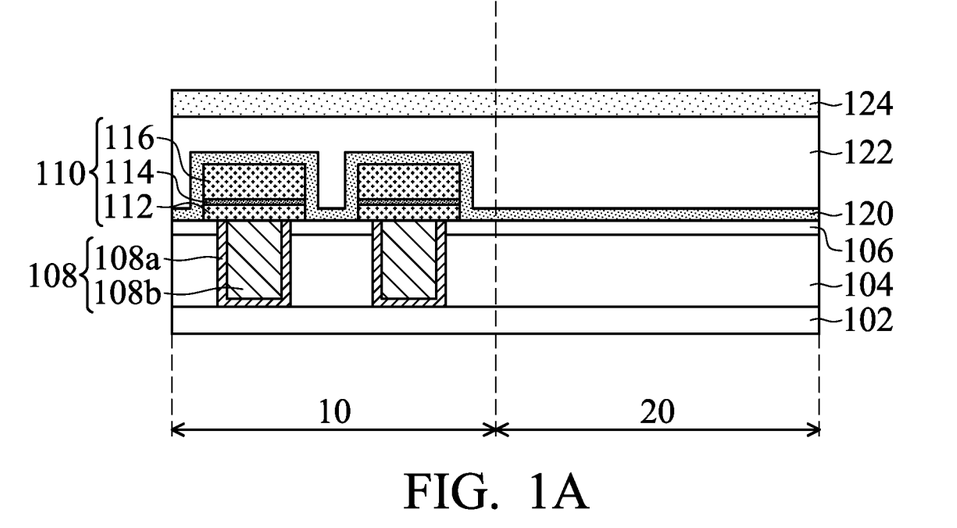
FIGS. 1A-1G show cross-sectional views of various stages of manufacturing a resistive random access memory in accordance with some embodiments of the present invention.

FIGS. 1A-1G show cross-sectional views of various stages of forming a RRAM 100 in accordance with some embodiments of the present invention. Referring to FIG. 1A, a substrate 102 including an array region 10 and a peripheral region 20 is provided. Then, a dielectric layer 104 and a first protective layer 106 are sequentially formed on the substrate 102. The substrate 102 may include a bulk semiconductor substrate (for example, a silicon substrate), a compound semiconductor substrate (for example, a IIIA-VA group semiconductor substrate), a silicon on insulator (SOI) substrate, and so on. The substrate 102 may be a doped or an undoped semiconductor substrate. In some embodiments, the substrate 102 is a silicon substrate. The material of the dielectric layer 104 is different from the material of the first protective layer 106. In some embodiments, the dielectric layer 104 may be a low-k dielectric material, such as Black Diamond™, and the first protective layer 106 may be tetraethoxysilane (TEOS), silicon nitride (SiN), or silicon carbonitride (SiCN).

Then, the dielectric layer 104 and the first protective layer 106 are patterned to form openings. The first protective layer 106 protects the dielectric layer 104 from moisture and subsequent etching processes. Then, a metal material is filled into the openings, and excess metal material on the first protective layer 106 is removed by a planarization process (such as, CMP) to form a contact plug 108 in the dielectric layer 104 and the first protective layer 106. In some embodiments, the contact plug 108 includes tungsten, aluminum, copper, other suitable metals, or a combination thereof. In some embodiments, the material of the contact plug 108 is copper, and thus the contact plug 108 has a good electrically conductive property. In other embodiments, the material of the contact plug 108 is tungsten, thereby preventing metal atoms from diffusing into the substrate 102 or the dielectric layer 104. In the present embodiment, the contact plug 108 includes a liner 108a and a conductive layer 108b. The liner 108a can improve the adhesion between the conductive layer 108a and the substrate 102, or the adhesion between the conductive layer 108a and the dielectric layer 104. The liner 108a can also prevent metal atoms from diffusing into the substrate 102 or the dielectric layer 104. The material of the liner 108a may include titanium, titanium nitride, tungsten nitride, tantalum or tantalum nitride, other suitable conductive materials, or a combination thereof. The material of the conductive layer 108a may include tungsten, aluminum, copper, other suitable metals, or a combination thereof.

Then, a plurality of memory cells 110 are formed on the substrate 102 in the array region 10. The location of the memory cell 110 may correspond to the location of the contact plug 108, and the memory cell 110 is electrically connected to the contact plug 108. In some embodiments, a patterned wiring layer (not shown) is also disposed between the substrate 102 and the dielectric layer 104, and the contact plugs 108 are configured to electrically connect the patterned wiring layers to the memory cells 110. The memory cell 110 can include a bottom electrode layer 112, a resistance switching layer 114, and a top electrode layer 116. For example, the memory cell 110 can be formed by the following method. Firstly, a bottom electrode material, a resistance switching material, and a top electrode material are sequentially formed on the first protective layer 106. Then, the bottom electrode material, the resistance switching material, and the top electrode material are patterned to form a plurality of memory cells 110 in the array region 10.

The bottom electrode layer 112 can be electrically connected to other components (not shown) by the contact plugs 108. The resistance switching layer 114 may be switched between different electrical resistance states by applying voltages to the bottom electrode layer 112 and the top electrode layer 116. The material of the bottom electrode layer 112 and the material of the top electrode layer 116 may include titanium, tantalum, titanium nitride, tantalum nitride, other suitable conductive materials, or a combination thereof. The bottom electrode layer 112 and the top electrode layer 116 may be a single layer structure formed of a single material or a multilayer structure formed of a plurality of different materials. In some embodiments, the bottom electrode layer 112 is a single layer structure formed of titanium nitride, and the top electrode layer 116 is a single layer structure formed of titanium. The bottom electrode layer 112 and the top electrode layer 116 may be formed by using a physical vapor deposition process, a chemical vapor deposition (CVD) process, or another suitable deposition process.

The material of the resistance switching layer 114 may include a single layer or a plurality of layers formed of transition metal oxides, for example, tantalum oxide ($Ta_2O_5$), hafnium oxide ($HfO_2$), aluminum oxide ($Al_2O_3$), zirconium oxide ($ZrO_2$), or a stack of a combination thereof. In some embodiments, the material of the resistance switching layer 114 may be a stack of aluminum oxide and tantalum oxide. The resistance switching layer 114 may be formed by, for example a sputtering process, an atomic layer deposition (ALD) process, a GM process, an evaporation process, or another suitable deposition process.

Then, a second protective layer 120 is formed to cover the array region 10 and the peripheral region 20, such that the second protective layer 120 conformally covers the memory cells 110. The second protective layer 120 may be a single layer structure formed of a single material or a multilayer structure formed of a plurality of different materials. In some embodiments, the second protective layer 120 is a dual-layer structure formed by a hydrogen barrier layer and a cap layer formed on the hydrogen barrier layer. In such an embodiment, the hydrogen barrier layer can prevent hydrogen from entering the substrate 102, thereby avoiding degradation or failure of the RRAM. The material of the hydrogen barrier layer may be a metal oxide (such as, aluminum oxide), a metal nitride, a metal oxynitride, or a combination thereof. The cap layer can reduce or avoid the damage to the memory cell 110 during subsequent processes. The material of the cap layer may be an oxide, a nitride or an oxynitride. In the present embodiment, the material of the cap layer is silicon oxide or silicon nitride. In other embodiments, the cap layer can be omitted.

Then, a gap-filling dielectric layer 122 is formed to cover the array region 10 and the peripheral region 20, such that the gap-filling dielectric layer 122 covers the memory cells 110 and fills the space between the memory cells. Thereafter, a planarization process is performed such that the gap-filling dielectric layer 122 has a flat top surface. Because the gap-filling dielectric layer 122 has a good gap-filling capability, the occurrence of the voids in the array region 10 can be avoided. As a result, the operation error of the RRAM can be reduced or avoided, and the yield and reliability of the product can be significantly improved. The material of the gap-filling dielectric layer 122 may include an oxide, such as, silicon oxide, aluminum oxide, hafnium oxide, hafnium oxynitride, silicon hafnium oxynitride, etc., and may be formed by a CVD process or an ALD process.

Then, a buffer layer 124 is formed to cover the gap-filling dielectric layer 122. The material of the buffer layer 124 may include silicon nitride or silicon carbonitride. The material of the buffer layer 124 is different from the material of the gap-filling dielectric layer 122. In one embodiment, the material of the buffer layer 124 is different from the material of the gap-filling dielectric layer 122 and the dielectric layer 104. In the present embodiment, the material of the buffer layer 124 is silicon nitride, and the material of the gap-filling dielectric layer 122 is silicon oxide.

Figure 1B:
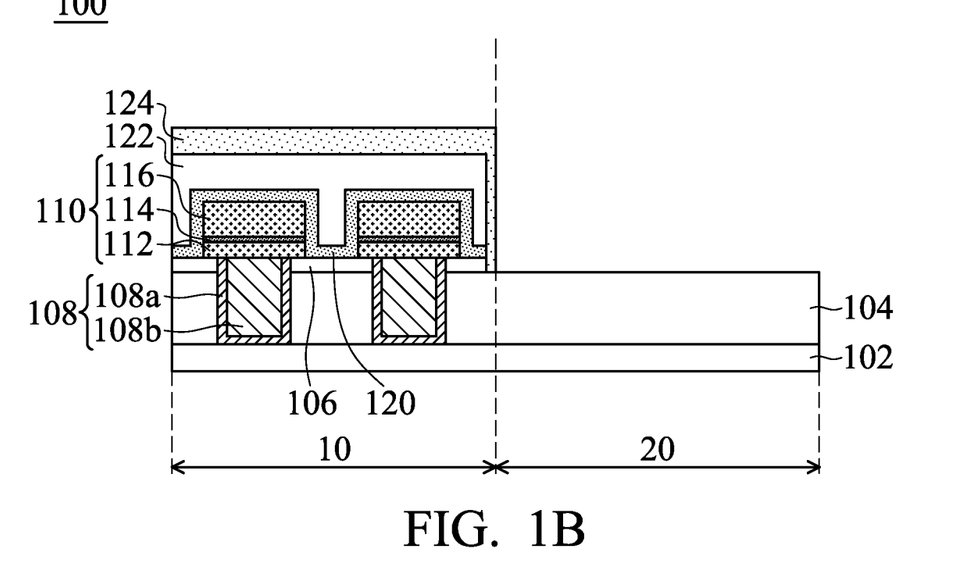

Referring to FIG. 1B, a patterning process is performed to remove all of the buffer layer 124, the gap-filling dielectric layer 122, the second protective layer 120, and the first protective layer 106 located in the peripheral region 20. Then, the buffer layer 124 is conformally formed to cover the array region 10 and the peripheral region 20, and the buffer layer 124 is disposed on the sidewall of the gap-filling dielectric layer 122. Thereafter, the buffer layer 124 located in the peripheral region 20 is removed. In other words, the entire gap-filling dielectric layer 122 is covered by the buffer layer 124, and the buffer layer 124 formed on the sidewall of the gap-filling dielectric layer 122 serves as a boundary between the array region 10 and the peripheral region 20. Thereby, the thickness of the buffer layer 124 on the top of the gap-filling dielectric layer 122 is greater than the thickness of the buffer layer 124 on the sidewall of the gap-filling dielectric layer 122.

Figure 1C:
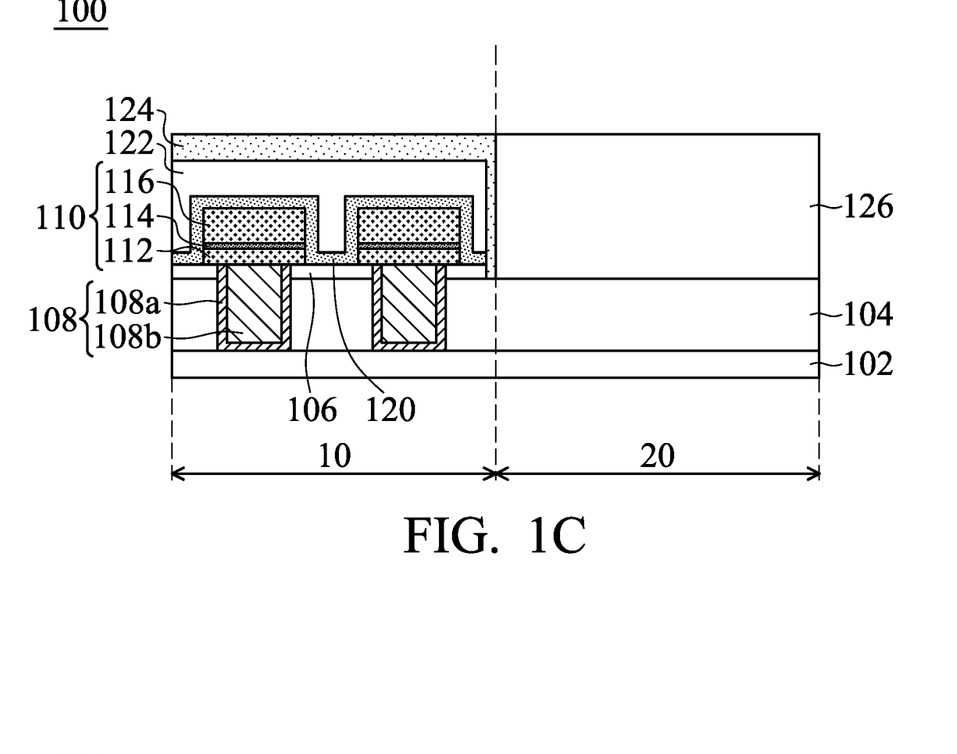

Referring to FIG. 1C, a low-k dielectric material is formed to cover the array region 10 and the peripheral region 20. Thereafter, a CMP is performed to form a first low-k dielectric layer 126 having a top surface that is coplanar with the top surface of the buffer layer 124. In other words, the low-k dielectric material located in the array region 10 is removed. The dielectric constant of the first low-k dielectric layer 126 is lower than the dielectric constant of the gap-filling dielectric layer 122, thereby increasing the operating speed of the logic circuit located in the peripheral region 20. In the present embodiment, by limiting the first low-k dielectric layer 126 in the peripheral region 20 where the memory cell 110 is absent, even if the gap-filling ability of the first low-k dielectric layer 126 is poor, the operation error of the RRAM will not occur. In the present embodiment, the material of the first low-k dielectric layer 126 is Black Diamond™. The material of the first low-k dielectric layer 126 is different from the material of the buffer layer 124.

Figure 1D:
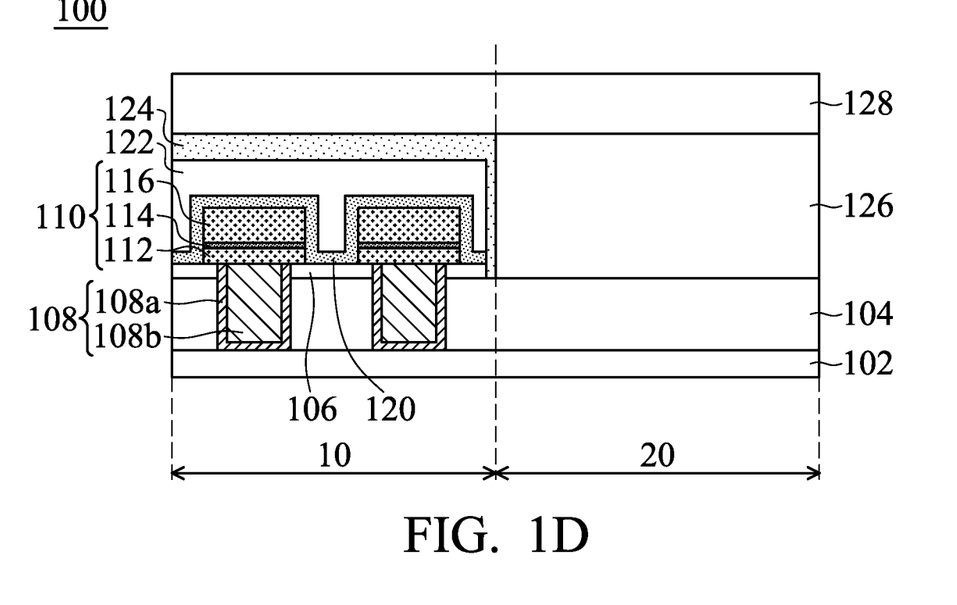

Referring to FIG. 1D, a second low-k dielectric layer 128 is formed on the buffer layer 124 and the first low-k dielectric layer 126. The material of the second low-k dielectric layer 128 may be the same as or similar to the material of the first low-k dielectric layer 126. In other words, the dielectric constant of the second low-k dielectric layer 128 may be less than 3. As a result, the operating speed of the logic circuit and the memory cells 110 can be improved.

Figure 1E:
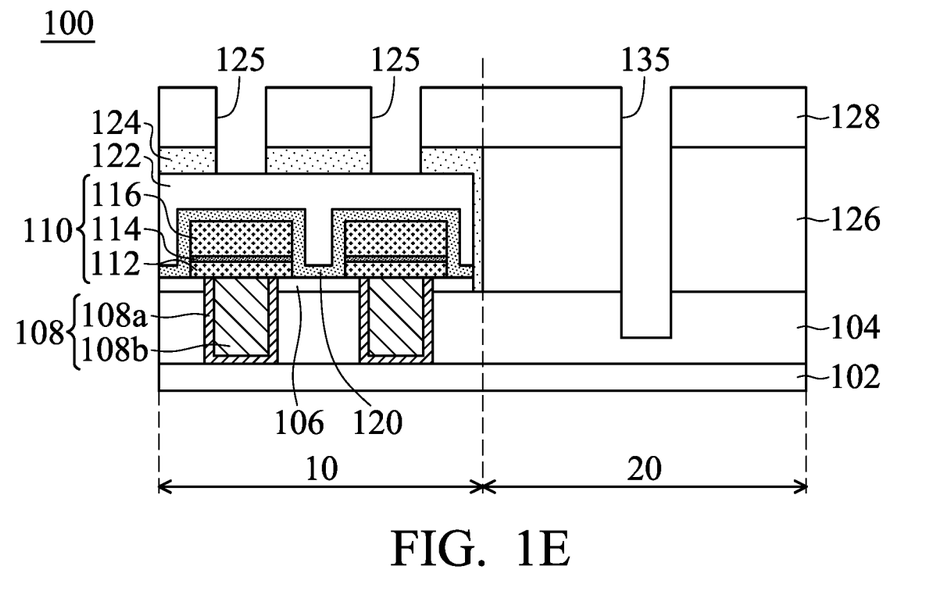

Referring to FIG. 1E, a first etching process is performed by using a first mask (not shown) to form a first opening 125 in the array region 10 and a second opening 135 in the peripheral region 20, The depth of the second opening 135 is greater than the depth of the first opening 125. The positions of the first openings 125 may correspond to the position of the memory cells 110. The first opening 125 passes through the second low-k dielectric layer 128 and the buffer layer 124 to expose the gap-filling dielectric layer 122. The second opening 135 passes through the second low-k dielectric layer 128 and the first low-k dielectric layer 126 to expose the dielectric layer 104. In the present embodiment, the first etching process is an anisotropic etching process. The first etching process removes a portion of the dielectric layer 104.

In the first etching process, by using an etching condition having a high selectivity respect to the low-k dielectric material, and covering the gap-filling dielectric layer 122 with the buffer layer 124, the depth of the second opening 135 can be easily configured to be greater than the depth of the first opening 125, such that the depth of the first opening 125 can be controlled to expose the position of the gap-filling dielectric layer 122. In other words, it ensures that the memory cell 110 is not damaged during the first etching process.

Figure 1F:
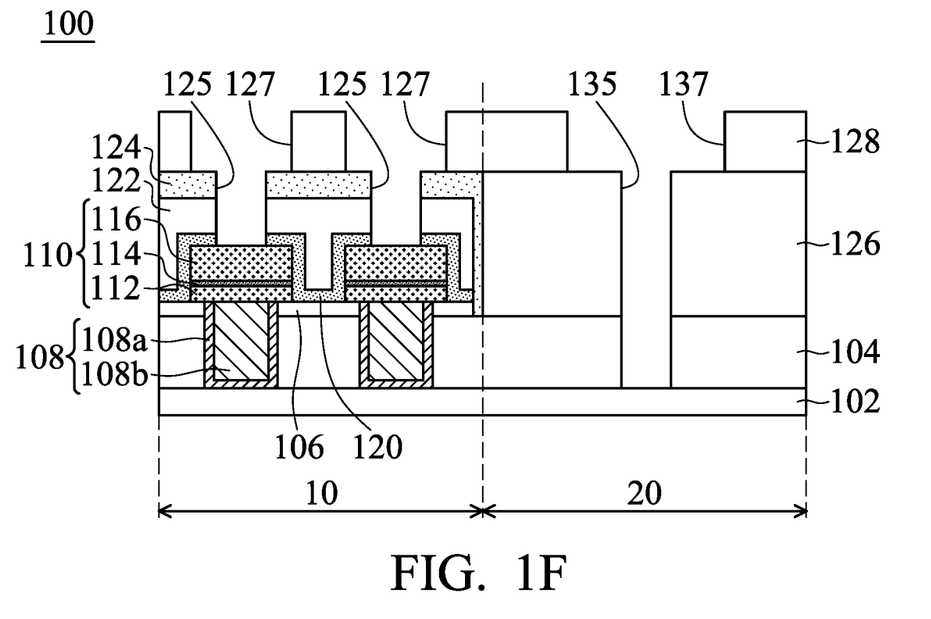

Referring to FIG. 1F, a second etching process is performed by using a second mask (not shown). After the second etching process, in the array region 10, the first opening 125 is deepened to expose the top electrode layer 116 of the memory cell 110, and the upper portion of the first opening 125 is enlarged to form the first trench 127 in the second low-k dielectric layer 128. After the second etching process, in the array region 20, the second opening 135 is deepened to expose the substrate 102, and the upper portion of the second opening 135 is enlarged to form the second trench 137 in the second low-k dielectric layer 128. In the present embodiment, the second etching process is an anisotropic etching process.

Figure 1G:
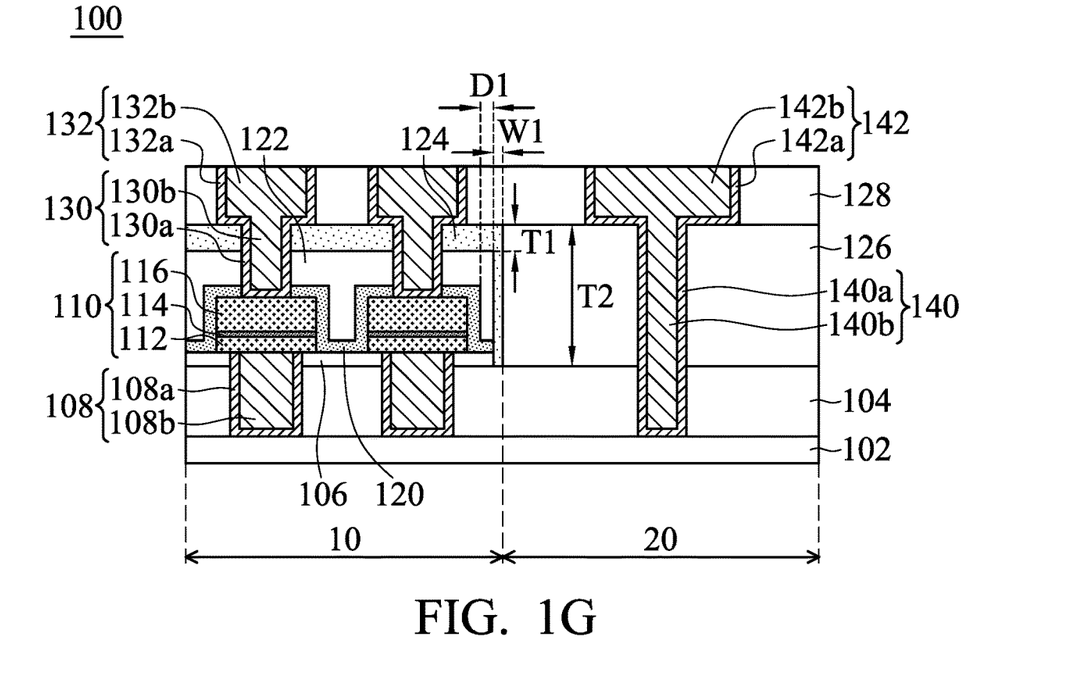

Referring to FIG. 1G, a conductive liner material is conformally deposited in the first opening 125, the first trench 127, the second opening 135, and the second trench 137 to form a conductive liner 130a on the surface of the first opening 125, a conductive liner 132a on the surface of the first trench 127, a conductive liner 140a on the surface of the second opening 135, and a conductive liner 142a formed on the surface of the second trench 137. Then, the first opening 125, the first trench 127, the second opening 135, and the second trench 137 are filled with a conductive material to form a conductive material layer 130b on the conductive liner 130a, a conductive layer 132b on the conductive liner 132a, a conductive material layer 140b on the conductive liner 140a, and a conductive material layer 142b on the conductive liner 142a. As a result, a first conductive plug 130 is formed in the first opening 125; a first conductive line 132 is formed in the first trench 127; a second conductive plug 140 is formed in the second opening 135; and a second conductive line 142 is formed in the second trench 137, The material of the conductive liner may include titanium, titanium nitride, tungsten nitride, tantalum, tantalum nitride, or a combination thereof. The conductive material may include tungsten, aluminum, copper, other suitable metals, or a combination thereof. In the present embodiment, the conductive liner material is titanium nitride, and the conductive material is copper which has good conductivity. Therefore, the operation speed of the logic circuit and the memory cells 110 can be improved. Afterwards, other conventional processes can be performed to complete the RRAM 100. These conventional processes will not be described in detail herein.

In the manufacturing method of the RRAM 100 provided in the present embodiment, the buffer layer 124 covers the entire array region 10. Such structure can significantly improve the yield and reliability of the product without significantly increasing the complexity of the process, the production cost, and the production time.

More specifically, the material of the gap-filling dielectric layer 122 has different properties from the material of the first low-k dielectric layer 126, such as hardness and mechanical strength. In the comparative embodiment in which the buffer layer 124 is not formed, during the CMP process described in FIG. 1C, the polishing pressure may cause cracking at the interface between the gap-filling dielectric layer 122 and the first low-k dielectric layer 126. As a result, the elements in array region 10 (such as, the memory cells 110) or the elements in the peripheral region (such as, the logic circuit) will be easily damaged due to the subsequent processes. For example, a subsequent process solution (such as, a slurry or an etching solution) may penetrate the array region 10 or the peripheral region 20 along the crack, thereby causing the damage of the elements. As a result, the yield and reliability of the memory are reduced. In the present embodiment, the buffer layer 124 is formed to cover the entire array region 10. Because the material of the buffer layer 124 is different from the material of the gap-filling dielectric layer 122, and the mechanical strength of the buffer layer 124 is better than the mechanical strength of the gap-filling dielectric layer 122, the buffer layer 124 can provide good support and improve the mechanical strength. As a result, even if cracking occurs, the elements of the array region 10 are protected by the buffer layer 124, thereby improving the yield and reliability of the product.

In the present embodiment, the material of the buffer layer 124 is different from the material of the first low-k dielectric layer 126, and the polishing rate of the buffer layer 124 is lower than the polishing rate of the first low-k dielectric layer 126. Therefore, in the CMP, the buffer layer 124 can serve as a polishing stop layer to ensure that the top surface of the first low-k dielectric layer 126 is coplanar with the top surface of the buffer layer 124. As a result, the second low-k dielectric layer 128 can have a planar top surface, and therefore, the yield of the product is improved. In some embodiments, during the CMP process described in FIG. 1C, the first low-k dielectric layer 126 has a first polishing rate PR1, and the buffer layer 124 has a second polishing rate PR2. The ratio (PR1/PR2) of the first polishing rate PR1 to the second polishing rate PR2 is 5-10.

Furthermore, in the comparative embodiment in which the buffer layer 124 is not formed, during the first etching process described in FIG. 1E, when the top electrode layer 116 is exposed by the first opening 125, the second opening 135 is not etched to a predetermined depth yet. As a result, if the first etching process is continued to complete the second opening 135, the exposed top electrode layer 116 will be greatly damaged, resulting in reduced reliability and yield. In the present embodiment, the material of the buffer layer 124 is different from the material of the first low-k dielectric layer 126, and the etching rate of the buffer layer 124 is lower than the etching rate of the first low-k dielectric layer 126. Therefore, the first opening 125 having a smaller depth and the second opening 135 having a larger depth are easily formed in the first etching process. In some embodiments, in the first etching process described in FIG. 1E, the buffer layer 124 has a first etching rate R1, the first low-k dielectric layer 126 has a second etching rate R2, and the ratio (R2/R1) of the second etching rate R2 to the first etching rate R1 is 5-20. Referring to FIG. 11E, after the first etching process, the second opening 135 passes through the first low-k dielectric layer 126, and the first opening 125 passes through the buffer layer 124. In other words, the depth of the first opening 125 is less than the depth of the second opening 135, and the top electrode layer 116 is not exposed. Therefore, damage to the top electrode layer 116 can be prevented during the first etching process. As a result, the reliability and yield of the memory device can be significantly improved.

On the other hand, in the second etching process described in FIG. 1F, the etching rate of the gap-filling dielectric layer 122 is similar to the etching rate of the second low-k dielectric layer 128. In the comparative embodiment in which the buffer layer 124 is not formed, during the second etching process described in FIG. 1F, the distance between the adjacent first openings 125 may become too close, thereby a short circuit is likely to occur. Therefore, the yield of the memory device is reduced, and it is disadvantageous for miniaturization of the memory device. In the present embodiment, the material of the buffer layer 124 is different from the material of the second low-k dielectric layer 128, and the etching rate of the buffer layer 124 is lower than the etching rate of the second low-k dielectric layer 128. Therefore, the width and profile of the first opening 125 can be precisely controlled. In some embodiments, during the second etching process described in FIG. 1F, the buffer layer 124 has a third etching rate R3, the second low-k dielectric layer 128 has a fourth etching rate R4, and the ratio (R4/R3) of the fourth etching rate R4 to the third etching rate R3 is 5-20. Referring to FIG. 1F, after the second etching process, the upper portion of the first opening 125 has a substantially uniform width, and the bottom surface of the first trench 127 is substantially flat. Therefore, the yield of the RRAM can be improved, and the miniaturization of the memory device is facilitated.

Referring to FIG. 1G, in some embodiments, the RRAM 100 is provided. The RRAM 100 includes the substrate 102 having the array region 10 and the peripheral region 20. In the array region 10, a plurality of memory cells 110, the second protective layer 120 conformally covering the memory cells 110, and the gap-filling dielectric layer 122 covering the second protective layer 120 are disposed on the substrate 102. Furthermore, the buffer layer 124 is only located in the array region 10 and covers the entire gap-filling dielectric layer 122. The material of the buffer layer 124 is different from the material of the gap-filling dielectric layer 122. The first low-k dielectric layer 126 is located on the substrate 102 and is only located in the peripheral region 20. The top surface of the first low-k dielectric layer 126 is coplanar with the top surface of the buffer layer 124. The second low-k dielectric layer 128 is located on the buffer layer 124 and the first low-k dielectric layer 126. In the array region 10, the first conductive plug 130 passes through the buffer layer 124 and the gap-filling dielectric layer 122. The first conductive plug 130 is in contact with one of the memory cells 110. In the peripheral region 20, the second conductive plug 140 passes through the first low-k dielectric layer 126. The first conductive line 132 and the second conductive line 142 are both located in the second low-k dielectric layer 128. The first conductive line 132 and the second conductive line 142 are in contact with the first conductive plug 130 and the second conductive plug 140, respectively.

In the RRAM 100 provided by the embodiments of the present invention, the buffer layer 124 is only located in the array region 10. In other words, there is no buffer layer 124 in the peripheral region 20. Thereby, the resistance-capacitance delay (RC-delay) can be reduced. As a result, the operating speed of the logic circuit is increased, and the bending of the substrate 102 is avoided.

The horizontal portion of the buffer layer 124 is between the second low-k dielectric layer 128 and the gap-filling dielectric layer 122, and the vertical portion of the buffer layer 124 is located between the gap-filling dielectric layer 122 and the first low-k dielectric layer 126. The vertical portion of the buffer layer 124 defines the edge of the array region 10. Because the buffer layer 124 has the vertical portion, the elements located in the array region 10 can be supported and well protected. Furthermore, the vertical portion of the buffer layer 124 is located only at the edge of the array region 10. Therefore, the distance between adjacent memory cells 110 is not increased, which is advantageous for miniaturization of the memory device.

Referring to FIG. 1G, the horizontal portion of the buffer layer 124 has a first thickness T1, and the first low-k dielectric layer 126 has a second thickness T2. In some embodiments, the ratio (T2/T1) of the second thickness T2 to the first thickness T1 is 6-13. Thereby, the occurrence of the above-mentioned cracking can be more effectively avoided during the CMP, and the depth of the opening can be more easily controlled during the first etching process.

Furthermore, referring to FIG. 1G, the vertical portion of the buffer layer 124 has a first width W1, and the vertical portion has a distance D1 from the second protective layer 120 which is formed on the sidewall of the memory cells 110. In some embodiments, the ratio (W1/D1) of the first width W1 to the distance D1 is 1-10. Thereby, the elements located in the array region 10 can be well supported and protected, and the miniaturization of the memory device can be facilitated.

Figure 2:
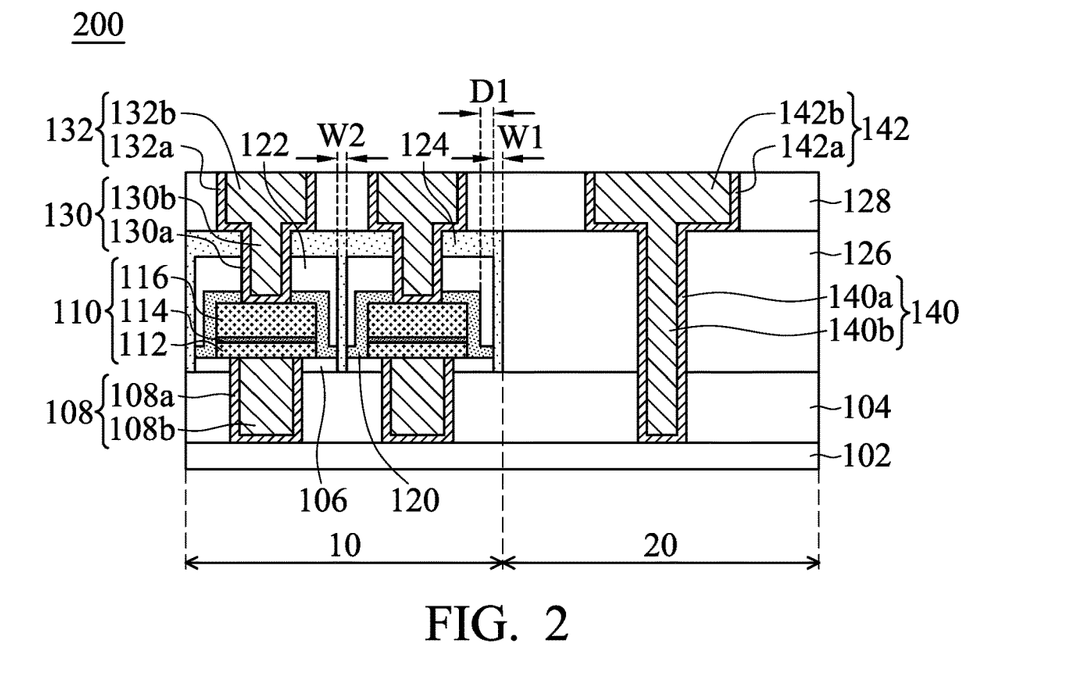
FIG. 2 shows a cross-sectional view of a resistive random access memory in accordance with other embodiments of the present invention.

FIG. 2 is a cross-sectional view of a RRAM 200 in accordance with other embodiments of the present invention. The RRAM 200 shown in FIG. 2 is similar to the RRAM 100 shown in FIG. 1G, and the difference is that the buffer layer 124 of FIG. 2 includes a plurality of vertical portions. In order to simplify the description, elements that are similar to those shown in FIG. 1G and the forming process steps thereof will not be described in detail herein.

Referring to FIG. 2, the buffer layer 124 includes a first vertical portion and a plurality of second vertical portions. When the patterning process described in FIG. 1B is performed, a trench may be formed between two adjacent memory cells 110. Then, the buffer layer 124 is formed and filled into the trenches. In this way, the second vertical portions of the buffer layer 124 can be formed. The first vertical portion of the buffer layer 124 is located between the gap-filling dielectric layer 122 and the first low-k dielectric layer 126, and the first vertical portion defines an edge of the array region 10. Each of the second vertical portions of the buffer layer 124 is located between two adjacent memory cells 110 and passes through the gap-filling dielectric layer 122. In the present embodiment, the buffer layer 124 has a plurality of second vertical portions whereby the elements located in the array region 10 can be well supported and protected. The first vertical portion has a first width W1 and the second vertical portion has a second width W2. In some embodiments, the ratio W1/W2 of the first width W1 to the second width W2 is 1-5. Thereby, it can be advantageous to simultaneously form the first vertical portion and the second vertical portions in the same step.

Figure 3:
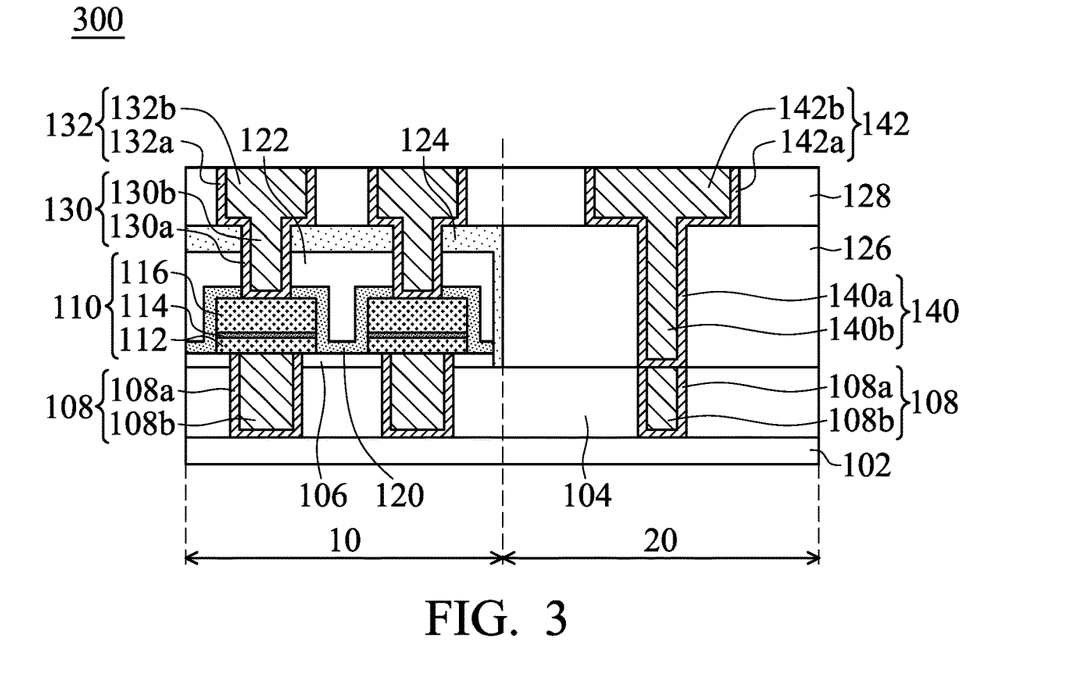
FIG. 3 shows a cross-sectional view of a resistive random access memory in accordance with other embodiments of the present invention.

FIG. 3 is a cross-sectional view of a RRAM 300 in accordance with other embodiments of the present invention. The RRAM 300 shown in FIG. 3 is similar to the RRAM 100 shown in FIG. 1G, and the difference is that the contact plug 108 shown in the FIG. 1G is also formed in the peripheral region 20. In order to simplify the description, the elements similar to those shown in FIG. 1G and the forming process steps thereof will not be described in detail herein.

Referring to FIG. 3, the contact plug 108 in the peripheral region 20 is located below the second conductive plug 140 and is in direct contact with the second conductive plug 140. When the contact plug 108 is formed in the dielectric layer 104, the contact plug 108 may be formed at a position in the peripheral region 20 where the second conductive plug 140 is predetermined to be formed. In this way, the RRAM 300 as shown in FIG. 3 can be obtained. In the present embodiment, the difference between the depth of the second opening 135 and the depth of the first opening 125 is smaller than that of the foregoing embodiment. Therefore, the depth of the opening can be controlled more easily during the first etching process.

Figure 4:
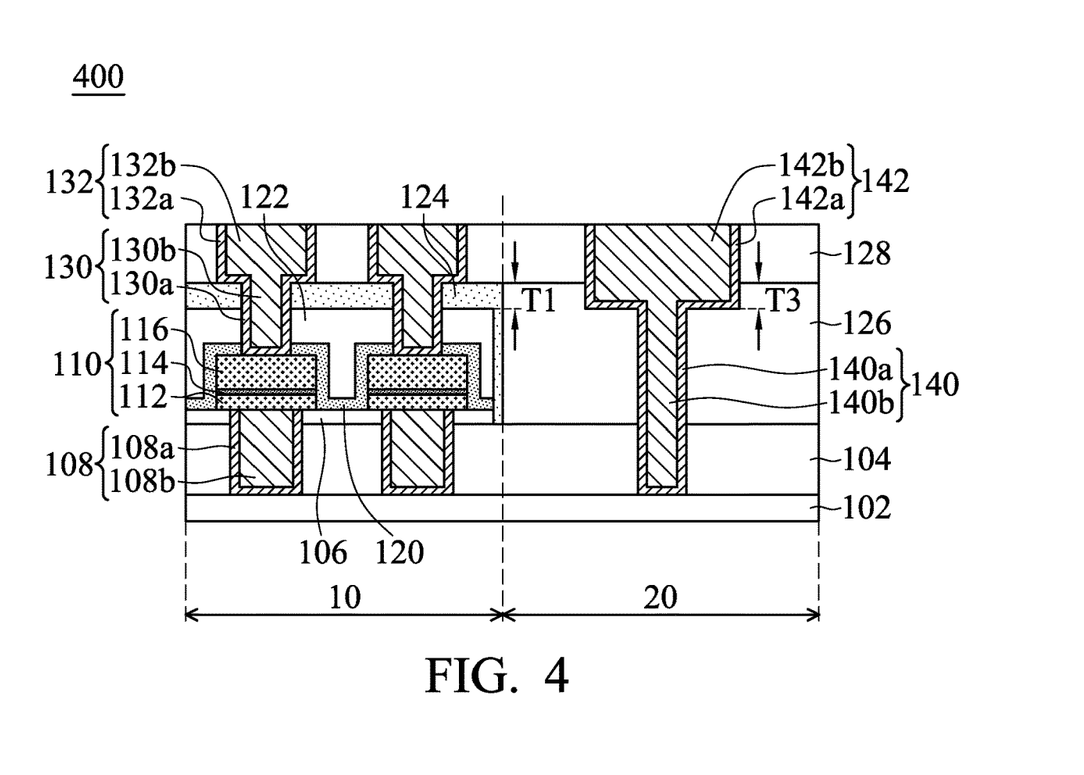
FIG. 4 shows a cross-sectional view of a resistive random access memory in accordance with other embodiments of the present invention.

FIG. 4 is a cross-sectional view of a RRAM 400, in accordance with other embodiments of the present invention. The RRAM 400 shown in FIG. 4 is similar to the RRAM 100 shown in FIG. 1G, and the difference is that the second conductive line 142 shown in FIG. 4 has a larger thickness. In order to simplify the description, the elements similar to those shown in FIG. 1G and the forming process steps thereof will not be described in detail herein.

Referring to FIG. 4, the bottom surface of the second conductive line 142 is lower than the bottom surface of the second low-k dielectric layer 128. The RRAM 400 as shown in FIG. 4 can be obtained by controlling the second etching process. In some embodiments, the second trench 137 is extended into the first low-k dielectric layer 126 by increasing the etching duration of the second etching process. In other embodiments, the second trench 137 is extended into the first low-k dielectric layer 126 by increasing the ratio of the fourth etching rate R4 to the third etching rate R3. In the present embodiment, the operating speed of the logic circuit can be improved by increasing the thickness of the second conductive line 142.

The horizontal portion of the buffer layer 124 has a first thickness T1, and the portion of the second conductive line 142 lower than the first low-k dielectric layer 126 has a third thickness T3. In some embodiments, the ratio T3/T1 of the third thickness T3 to the first thickness T1 is 1-5. Thereby, damage to the memory cells 110 or the substrate 102 (the portion located below the second opening 135) caused by overetching can be prevented during the second etching process.

In summary, in the RRAM provided by the embodiments of the present invention, a buffer layer is formed to cover the entire array region, thereby improving the mechanical strength of the gap-filling dielectric layer. Even if the gap-filling dielectric layer in the array region and the dielectric layer in the peripheral region use different kinds of dielectric material, the gap-filling dielectric layer is not easily damaged during the CMP. Therefore, the dielectric materials in the array area and the peripheral area can each be selected independently, to meet requirements. Furthermore, the buffer layer protects the memory cells located in the array region during the etching process. Therefore, the openings in the array region and the peripheral region can be formed simultaneously (i.e., in the same etching process). As a result, the yield and reliability of the product can be significantly improved without significantly increasing the complexity of the process, the production cost, and the production time.

Although the disclosure has been described by way of example and in terms of the preferred embodiments, it should be understood that various modifications and similar arrangements (as would be apparent to those skilled in the art) can be made herein without departing from the spirit and scope of the disclosure as defined by the appended claims.

What is claimed is:

1. A resistive random access memory, comprising:
    a substrate, wherein the substrate comprises an array region and a peripheral region;
    a plurality of memory cells located on the substrate and in the array region;
    a gap-filling dielectric layer located in the array region and covering the memory cells;
    a buffer layer covering the gap-filling dielectric layer, wherein the buffer layer is only located in the array region, and a material of the buffer layer is different from a material of the gap-filling dielectric layer;
    a first low-k dielectric layer only located in the peripheral region, wherein a material of the first low-k dielectric layer is different from the material of the buffer layer, a dielectric constant of the first low-k dielectric layer is less than 3, and a top surface of the first low-k dielectric layer is coplanar with a top surface of the buffer layer; and
    a first conductive plug passing through the buffer layer and the gap-filling dielectric layer, wherein the first conductive plug is in contact with one of the memory cells.

2. The resistive random access memory as claimed in claim 1, further comprising:
    a second low-k dielectric layer located on the buffer layer and the first low-k dielectric layer, wherein a dielectric constant of the second low-k dielectric layer is less than 3, and wherein a horizontal portion of the buffer layer is located between the second low-k dielectric layer and the gap-filling dielectric layer, a first vertical portion of the buffer layer is located between the gap-filling dielectric layer and the first low-k dielectric layer, and the first vertical portion defines an edge of the array area.

3. The resistive random access memory as claimed in claim 2, wherein the buffer layer further comprises a second vertical portion, and the second vertical portion passes through the gap-filling dielectric layer and is located between two adjacent memory cells.

4. The resistive random access memory as claimed in claim 3, wherein the first vertical portion has a first width W1, the second vertical portion has a second width W2, and a ratio (W1/W2) of the first width W1 to the second width W2 is 1-5.

5. The resistive random access memory as claimed in claim 3, wherein the horizontal portion of the buffer layer has a first thickness T1, the first low-k dielectric layer has a second thickness T2, and a ratio (T2/T1) of the second thickness T2 to the first thickness T1 is 6-13.

6. The resistive random access memory as claimed in claim 2, further comprising:
    a second protective layer disposed in the array region and conformally covering the memory cells, wherein the second protective layer is located between the memory cells and the gap-filling dielectric layer;
    a first conductive line located in the second low-k dielectric layer and being in contact with the first conductive plug;
    a second conductive plug located in the peripheral region and passing through the first low-k dielectric layer; and
    a second conductive line located in the second low-k dielectric layer and being in contact with the second conductive plug.

7. The resistive random access memory as claimed in claim 6, wherein the first vertical portion has a first width W1, there is a distance D1 between the first vertical portion and the second protective layer, and a ratio (W1/D1) of the first width W1 to the distance D1 is 1-10.

8. The resistive random access memory as claimed in claim 6, wherein a bottom surface of the second conductive line is lower than a bottom surface of the second low-k dielectric layer.

9. The resistive random access memory as claimed in claim 2, wherein the horizontal portion of the buffer layer has a first thickness T1, the first low-k dielectric layer has a second thickness T2, and a ratio (T2/T1) of the second thickness T2 to the first thickness T1 is 6-13.

10. The resistive random access memory as claimed in claim 1, wherein a material of the buffer layer comprises silicon nitride or silicon carbonitride.

11. A method for manufacturing a resistive random access memory, comprising:
    providing a substrate, wherein the substrate comprises an array region and a peripheral region;
    forming a plurality of memory cells on the substrate and in the array region;
    forming a gap-filling dielectric layer in the array region and covering the memory cells;
    forming a buffer layer covering the gap-filling dielectric layer, wherein the buffer layer is only located in the array region, and a material of the buffer layer is different from a material of the gap-filling dielectric layer;
    forming a first low-k dielectric layer only in the peripheral region, wherein a material of the first low-k dielectric layer is different from the material of the buffer layer, a dielectric constant of the first low-k dielectric layer is less than 3, and a top surface of the first low-k dielectric layer is coplanar with a top surface of the buffer layer; and
    forming a first conductive plug, wherein the first conductive plug extends through the buffer layer and the gap-filling dielectric layer, and is in contact with one of the memory cells.

12. The method for manufacturing the resistive random access memory as claimed in claim 11, further comprising:

forming a second protective layer in the array region to conformally cover the memory cells;

forming a second low-k dielectric layer on the buffer layer and the first low-k dielectric layer;

performing a first etching process to form a first opening in the array region through the second low-k dielectric layer and the buffer layer;

performing a second etching process, wherein after the second etching process, the first opening is deepened to expose one of the memory cells, and the first opening is enlarged to form a first trench in the second low-k dielectric layer;

conformally depositing a conductive liner in the first opening and the first trench; and depositing a conductive material to fill the first opening and the first trench and to form the first conductive plug and a first conductive line in the first opening and in the first trench, respectively, wherein the first conductive line is in contact with the first conductive plug.

13. The method for manufacturing the resistive random access memory as claimed in claim 12, wherein after the first etching process, a second opening is formed in the peripheral region, and the second opening passes through the second low-k dielectric layer and the first low-k dielectric layer.

14. The method for manufacturing the resistive random access memory as claimed in claim 13, wherein an etching rate of the buffer layer in the first etching process is a first etching rate R1, an etching rate of the first low-k dielectric layer in the first etching process is a second etching rate R2, and a ratio R2/R1 of the second etching rate R2 to the first etching rate R1 is 5-20; and an etching rate of the buffer layer in the second etching process is a third etching rate R3, and an etching rate of the second low-k dielectric layer in the second etching process is a fourth etching rate R4, and a ratio R4/R3 of the four etching rate R4 to the third etching rate R3 is 5-20.

\* \* \* \* \*